United States Patent
Hamada et al.

(10) Patent No.: US 11,176,970 B2
(45) Date of Patent: *Nov. 16, 2021

(54) ROUTING FOR POWER SIGNALS INCLUDING A REDISTRIBUTION LAYER

(71) Applicant: Micron Technology, Inc., Boise, ID (US)

(72) Inventors: Takayori Hamada, Kanagawa (JP); Yasuhiko Tanuma, Kanagawa (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/909,677

(22) Filed: Jun. 23, 2020

(65) Prior Publication Data

US 2020/0321034 A1    Oct. 8, 2020

Related U.S. Application Data

(63) Continuation of application No. 16/366,100, filed on Mar. 27, 2019, now Pat. No. 10,811,059.

(51) Int. Cl.
*G11C 5/06* (2006.01)
*H01L 23/522* (2006.01)
*G11C 7/10* (2006.01)

(52) U.S. Cl.
CPC ............ *G11C 5/063* (2013.01); *G11C 7/1084* (2013.01); *H01L 23/5226* (2013.01)

(58) Field of Classification Search
CPC ........... G11C 5/025; G11C 5/04; G11C 5/063; G11C 11/4097; G11C 7/18
USPC .................................................... 365/63, 51
See application file for complete search history.

(56) References Cited

U.S. PATENT DOCUMENTS

| | | |
|---|---|---|
| 5,790,839 A | 8/1998 | Luk et al. |
| 5,812,490 A | 9/1998 | Tsukude |
| 6,172,935 B1 | 1/2001 | Wright et al. |
| 6,937,494 B2 | 8/2005 | Funaba et al. |
| 7,646,654 B2 | 1/2010 | Merritt et al. |
| 8,116,114 B2 | 2/2012 | Kobayashi et al. |
| 9,117,496 B2 | 8/2015 | Shaeffer et al. |
| 9,343,506 B2 * | 5/2016 | Pellizzer ................. H01L 45/04 |
| 10,115,709 B1 | 10/2018 | Sasaki et al. |

(Continued)

FOREIGN PATENT DOCUMENTS

| | | |
|---|---|---|
| JP | 2017-174994 A | 9/2017 |
| KR | 10-2019-0017266 A | 2/2019 |

OTHER PUBLICATIONS

International Search Report for Application No. PCT/US2020/017259, dated Jun. 9, 2020, 7 pages.

(Continued)

*Primary Examiner* — Son T Dinh
(74) *Attorney, Agent, or Firm* — TraskBritt

(57) ABSTRACT

Semiconductor devices and systems are disclosed. A semiconductor device includes a redistribution layer including a first polygonal structure for conveying a first power signal and including a first cutout region. The semiconductor device further includes a second polygonal structure for conveying a second power signal. Further, the semiconductor device includes an island polygon for conveying a third power signal and positioned within the first cutout region, wherein the island polygon does not touch the first polygonal structure.

20 Claims, 8 Drawing Sheets

(56) References Cited

U.S. PATENT DOCUMENTS

| | | |
|---|---|---|
| 10,811,059 B1 * | 10/2020 | Hamada .............. G11C 5/147 |
| 2006/0245267 A1 | 11/2006 | Choi |
| 2007/0291557 A1 | 12/2007 | Nishio et al. |
| 2008/0304340 A1 | 12/2008 | Kyung et al. |
| 2009/0161475 A1 | 6/2009 | Kim et al. |
| 2010/0115172 A1 | 5/2010 | Gillingham et al. |
| 2013/0162308 A1 | 6/2013 | Sakashita et al. |
| 2014/0082260 A1 | 3/2014 | Oh et al. |
| 2014/0117424 A1 | 5/2014 | Kim |
| 2015/0348905 A1 | 12/2015 | Tsai et al. |
| 2016/0181214 A1 | 6/2016 | Oh et al. |
| 2016/0196878 A1 | 7/2016 | Kim et al. |
| 2016/0240471 A1 | 8/2016 | Klowak et al. |
| 2016/0293227 A1 | 10/2016 | Chi |
| 2017/0077276 A1 | 3/2017 | Suzuki et al. |
| 2017/0323875 A1 | 11/2017 | Tam |
| 2017/0338175 A1 | 11/2017 | Liu et al. |
| 2018/0090185 A1 | 3/2018 | Hossain et al. |
| 2018/0130739 A1 | 5/2018 | Miura et al. |
| 2018/0218762 A1 | 8/2018 | Matsui |
| 2019/0081623 A1 | 3/2019 | Mizan et al. |

OTHER PUBLICATIONS

International Search Report for Application No. PCT/US2020/018742, dated Jun. 16, 2020, 3 pages.
International Search Report from International Application No. PCT/US2020/017288, dated Jun. 5, 2020, 4 pages.
International Written Opinion from International Application No. PCT/US2020/017288, dated Jun. 5, 2020, 5 pages.
Written Opinion of the International Searching Authority for Application No. PCT/US2020/017259, ,dated Jun. 9, 2020, 6 pages.
Written Opinion of the International Searching Authority for Application No. PCT/US2020/018742, dated Jun. 16, 2020, 4 pages.

\* cited by examiner

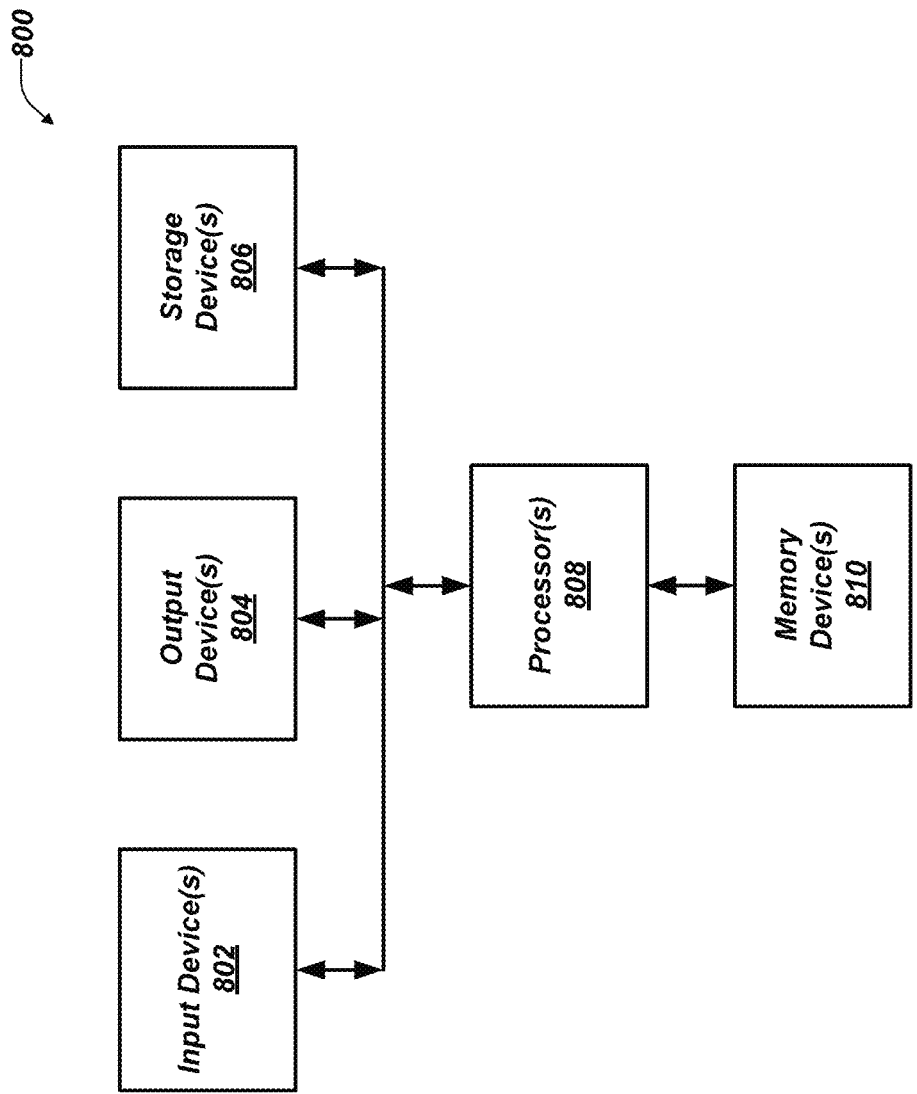

ROUTING FOR POWER SIGNALS INCLUDING A REDISTRIBUTION LAYER

CROSS-REFERENCE TO RELATED APPLICATION

This application is a continuation of U.S. patent application Ser. No. 16/366,100, filed Mar. 27, 2019, now U.S. Pat. No. 10,811,059, issued Mar. 27, 2019, the disclosure of which is hereby incorporated herein in its entirety by this reference.

TECHNICAL FIELD

Embodiments of the disclosure relate generally to power and ground routing on semiconductor devices and more specifically to power and ground routing using a redistribution layer.

BACKGROUND

Semiconductor devices include many circuits interconnected with multiple layers of conductor wires. Each conductor layer is insulated from other conductor layers with some form of insulating or dielectric material. Even with many wiring layers available, routing of clock signals, large signal busses, and power signals is a challenge due to the severe size constraint put on designers to make a semiconductor device as small as possible. Power consumption is also a design constraint for semiconductor devices. Moreover, power signal routing can be particularly challenging due to the need to keep resistance along a power signal as low as possible.

When new design elements are presented and those new design elements are constrained to fit in existing semiconductor device sizes, footprints, and aspect ratios, it can be particularly challenging to accommodate these new design elements into an existing area of a device without changing the size of the device.

There is a continuing need to reduce power consumption and reduce layout sizes of wiring layers by addressing various design elements, which may include circuit design, logic design, and layout considerations.

BRIEF DESCRIPTION OF THE DRAWINGS

FIG. 8 is a simplified block diagram of a system implemented according to one or more embodiments described herein.

DETAILED DESCRIPTION

Figure 1A:
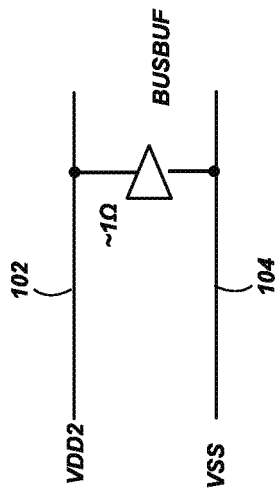
FIG. 1A illustrates a buffer circuit using a single power signal.

In the following detailed description, reference is made to the accompanying drawings, which form a part hereof, and in which are shown, by way of illustration, specific example embodiments in which the present disclosure may be practiced. These embodiments are described in sufficient detail to enable a person of ordinary skill in the art to practice the present disclosure. However, other embodiments may be utilized, and structural, material, and process changes may be made without departing from the scope of the disclosure. The illustrations presented herein are not meant to be actual views of any particular method, system, device, or structure, but are merely idealized representations that are employed to describe the embodiments of the present disclosure. The drawings presented herein are not necessarily drawn to scale. Similar structures or components in the various drawings may retain the same or similar numbering for the convenience of the reader; however, the similarity in numbering does not mean that the structures or components are necessarily identical in size, composition, configuration, or any other property.

Reference throughout this specification to "one embodiment," "an embodiment," or similar language means that a particular feature, structure, or characteristic described in connection with the indicated embodiment is included in at least one embodiment of the present disclosure. Thus, the phrases "in one embodiment," "in an embodiment," and similar language throughout this specification may, but do not necessarily, all refer to the same embodiment.

As used herein, spatially relative terms, such as "beneath," "below," "lower," "bottom," "above," "upper," "top," "front," "rear," "left," "right," and the like, may be used for ease of description to describe one element or feature's relationship to another element(s) or feature(s) as illustrated in the figures. Unless otherwise specified, the spatially relative terms are intended to encompass different orientations of the device in use or operation in addition to the orientation depicted in the figures. For example, if a device in the figures is turned over, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The device may be otherwise oriented (rotated 90 degrees or at other orientations) and the spatially relative descriptors used herein interpreted accordingly. In addition, reference to an element as being "on" or "over" another element means and includes the element being directly on top of, adjacent to, underneath, or in direct contact with the other element. It also includes the element being indirectly on top of, adjacent to, underneath, or near the other element, with other elements present therebetween. In contrast, when an element is referred to as being "directly on" another element, there are no intervening elements present.

Some drawings may illustrate signals as a single signal for clarity of presentation and description. It will be understood by a person of ordinary skill in the art that the signal may represent a bus of signals, wherein the bus may have a variety of bit widths and the present invention may be implemented on any number of data signals including a single data signal.

As used herein, the singular forms "a," "an," and "the" are intended to include the plural forms as well, unless the context clearly indicates otherwise. In addition, it should be understood that any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. Also, unless stated otherwise a set of elements may comprise one or more elements.

As used herein, "and/or" includes any and all combinations in the inclusive and alternate forms of one or more of the associated listed items.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

Elements described herein may include multiple instances of the same element. These elements may be generically indicated by a numerical designator (e.g., 110) and specifically indicated by the numerical indicator followed by an alphabetic designator (e.g., 110A) or a numeric indicator preceded by a "dash" (e.g., 110-1). For ease of following the description, for the most part element number indicators begin with the number of the drawing on which the elements are introduced or most fully discussed. Thus, for example, element identifiers on a FIG. 1 will be mostly in the numerical format 1xx and elements on a FIG. 4 will be mostly in the numerical format 4xx.

Headings may be included herein to aid in locating certain sections of detailed description. These headings should not be considered to limit the scope of the concepts described under any specific heading. Furthermore, concepts described in any specific heading are generally applicable in other sections throughout the entire specification.

Embodiments of the present disclosure use routing on a redistribution layer and lower level wiring layers to route an additional power signal into an area of a semiconductor device that did not have that additional power signal. This new power signal routing is done without changing the size of this area of the semiconductor device.

The description herein concentrates on memory device as well as bus signal routing and power routing on the memory devices. However, embodiments of the present disclosure may be used in other types of semiconductor devices and with circuit configurations other than those used as examples in the discussion below.

FIG. 1A illustrates a buffer circuit using a single power signal. In many semiconductor devices, a single ground signal 104 (VSS) and a single power signal 102 (VDD2) would be used to power buffers and other circuitry on the device in any given region. Other power signals may be used for other circuitry, however in general, power signals are localized to a specific region, function, or type of circuitry.

Figure 1B:
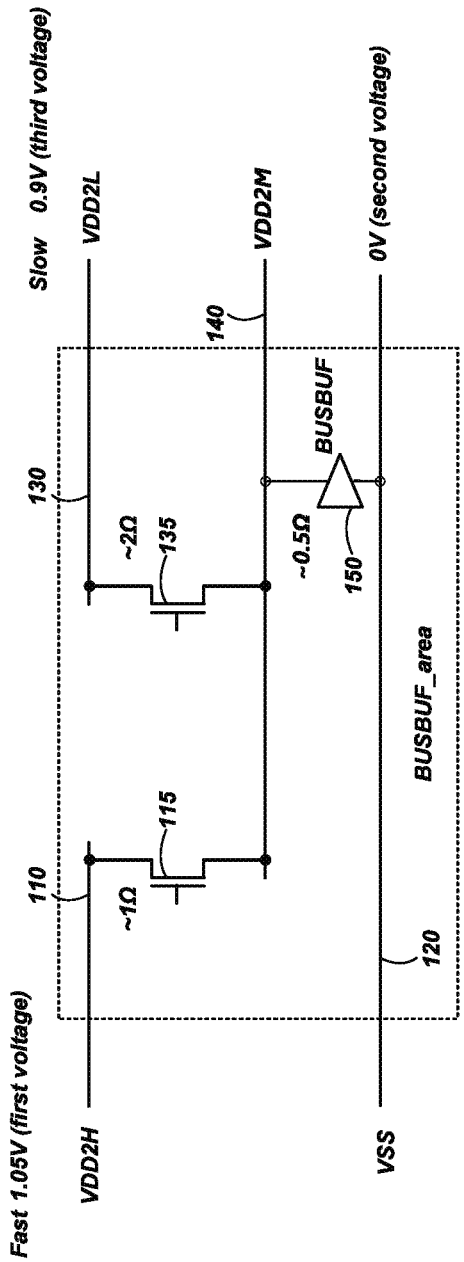
FIG. 1B illustrates a buffer circuit using an operating power signal selected from one of two different power signals.

FIG. 1B illustrates a buffer circuit using an operating power signal 140 (VDD2M) selected from one of two different power signals. Embodiments of the present disclosure reduce power consumed by semiconductor devices by including two different VDD voltage levels. Switches (115 and 135) pass one or the other of a relatively high voltage 110 (e.g., 1.05 volts) or a relative low voltage 130 (e.g., 0.9 volts) onto an operating power signal 140. The operating power signal 140 along with VSS 120 at 0 volts is used to drive a BUSBUF block of buffers 150, as well as possibly a variety of other electronic circuits (not shown). VSS may also referred to herein as a second voltage 120 or second power signal 120.

VDD2H is a first power signal 110 at the higher voltage level for powering the devices when higher speed is needed. VDD2L is a third power signal 130 for powering the devices when a lower speed is acceptable. Because these are power signals, low impedance is important so using wiring layers with low sheet resistance and the availability of wider wiring traces is useful. For example, for VDD2H an impedance of less than about one Ohm between the voltage source and the operating power signal may be useful. Similarly, for VDD2L an impedance of less than about two Ohms between the voltage source and the operating power signal may be useful. Because of the need for such low impedances, switches 115 and 135 may include many transistors in parallel and these transistors may include wide gate widths. Signal routing impedance is maintained very low by using routing layers as described below.

FIG. 1B shows a buffer circuit for data busses. However, embodiments of the present disclosure can be used for a variety of circuitry and crowded routing regions where low impedance power signals are needed. As non-limiting examples, embodiments of the present disclosure may be used for command buses, address busses, as well as other crowded signal routing areas.

Figure 2:
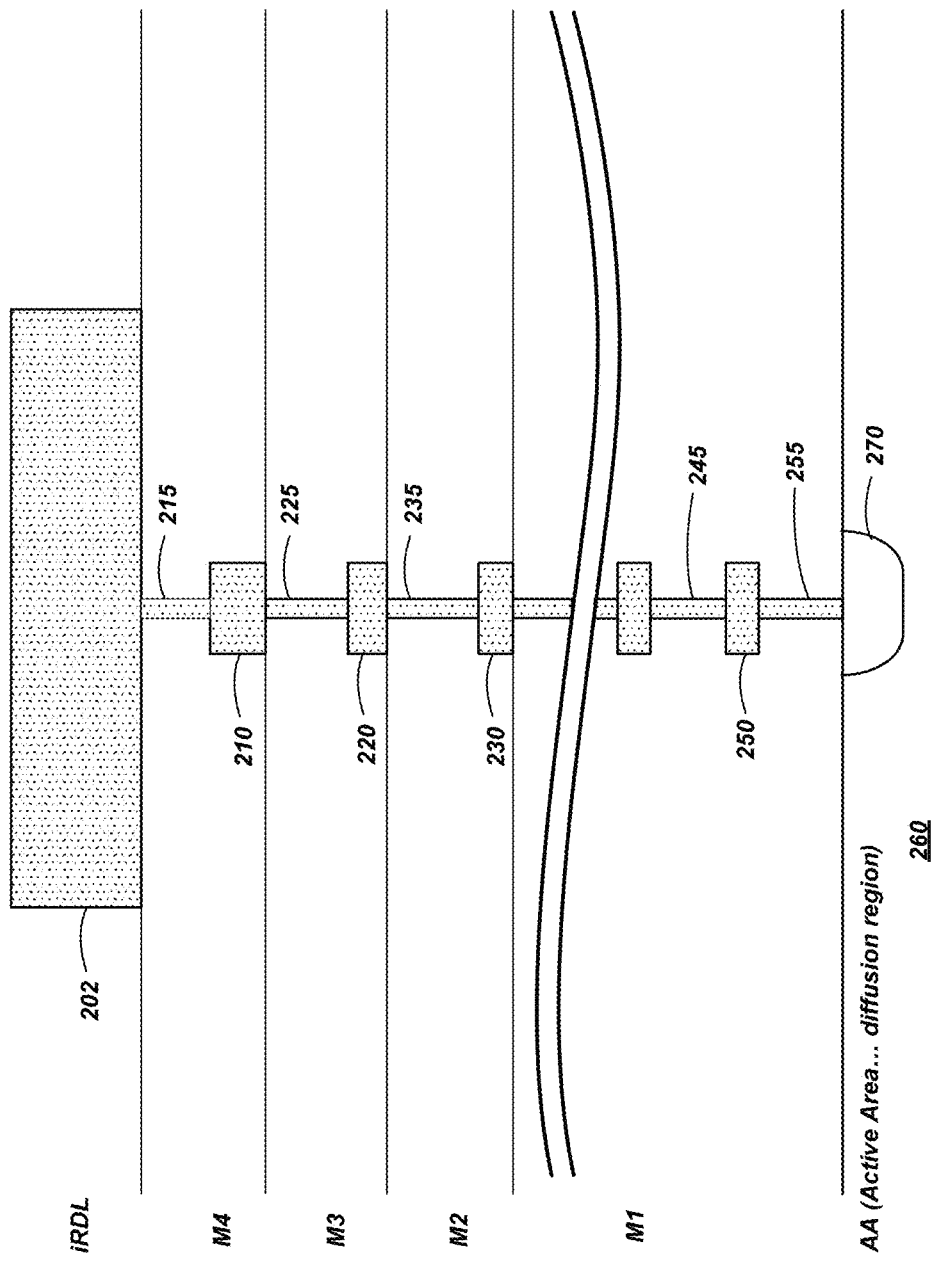
FIG. 2 is a cross-section view of a semiconductor device showing various layers.

FIG. 2 is a cross-section view of a semiconductor device showing various layers. A substrate 260 includes many different active areas (i.e., diffusion regions 270) for creating various electronic devices.

Some definitions will assist in referring to the various layers above the substrate 260. Generally, wiring layers are defined upwards from the substrate 260. Thus, in the FIG. 2 representation, working from the bottom up, a lower layer may be configured as polysilicon 250 or other material suitable for fabricating gate nodes of transistors. M1 is a first metal layer, M2 is a second metal layer, M3 is a third metal layer, M4 is a fourth metal layer, and iRDL is a metal redistribution layer. While generally referred to as metal layers, these layers may be configured with a variety of types of metals or other conductive material with a low sheet resistance. These metal layers may also be referred to as wiring layers, routing layers, and conducting layers.

However, depending on the fabrication process, there may be a varying number of wiring layers. Embodiments of the present disclosure are mostly associated with the iRDL layer and upper wiring layers of the semiconductor device.

As a result, and since the number of metal layers may be different for different embodiments, in some descriptions and the claims it is more appropriate to refer to wiring layers from the top down. Therefore, the topmost layer 202 is a conducting layer that will also be referred to herein as a redistribution layer 202, a topmost conducting layer 202, a topmost wiring layer 202, and an iRDL layer 202. The wiring layer labeled as M4 in FIG. 2 may also be referred to herein as a first conducting layer 210, a first wiring layer 210, and a first routing layer 210. Similarly, the wiring layer labeled M3 in FIG. 2 may also be referred to herein as a second conducting layer 220, a second wiring layer 220, and a second routing layer 220. Finally, the wiring layer labeled M2 in FIG. 2 may also be referred to herein as a third conducting layer 230, a third wiring layer 210, and a third routing layer 230.

For purposes of describing the drawings it is generally more convenient to use the M2, M3, M4, and iRDL designations. However, the reader should keep in mind that these layer definitions also translate as follows: from M2 to third layer, from M3 to second layer, from M4 to first layer, and from iRDL to topmost layer.

Contacts are positioned between the various conducting layers for routing signals between different layers. Contacts between all the various layers are generally referred to as contacts, but may also be referred to as vias and contact plugs.

Thus, the contacts 215 between the iRDL layer 202 and the M4 layer 210 are referred to as M4 contacts 215 or first-layer contacts 215. Contacts 225 between the M4 layer 210 and the M3 layer 220 are referred to as M3 contacts 225 or second-layer contacts 225. Contacts 235 between the M3 layer 220 and the M2 layer 230 are referred to as M2 contacts 235 or third-layer contacts 235.

While not specifically shown, insulating material or dielectric material fills the regions between the substrate, the contacts, and the conducting layers up to the iRDL layer 202.

In this cross-section view, an x-axis may be considered as left to right, a z-axis may be considered as bottom to top, and a y-axis may be considered as into the drawing sheet. Thus, most cross-section views are in an x-z plane, as shown in FIG. 2, or a y-z plane. Plan views, on the other hand, are generally considered to be in an x-y plane. Signals can generally be considered as long thin strips that can be routed in many different directions, however they are mostly routed in an x-direction or a y-direction (into and out of the drawing sheet) as shown in FIG. 2.

FIG. 2 illustrates the various contacts (215, 225, 235, 245, and 255) as stacked on top of each other. However, a person having ordinary skill in the art will recognize that contacts can be staggered and placed in any of the x and y directions as long as the contact has a routing layer below it and a routing layer above it. The iRDL layer 202 may be configured as a relatively thick layer and may include wide signal traces. As a result, impedance of signal traces on the iRDL layer can be very low, which makes this layer good for power and ground signal routing. The M4 layer 210 may also be configured as somewhat thicker that the lower routing layers. Therefore, the M4 layer 210 is also a good layer for power and ground signal routing.

Figure 3:
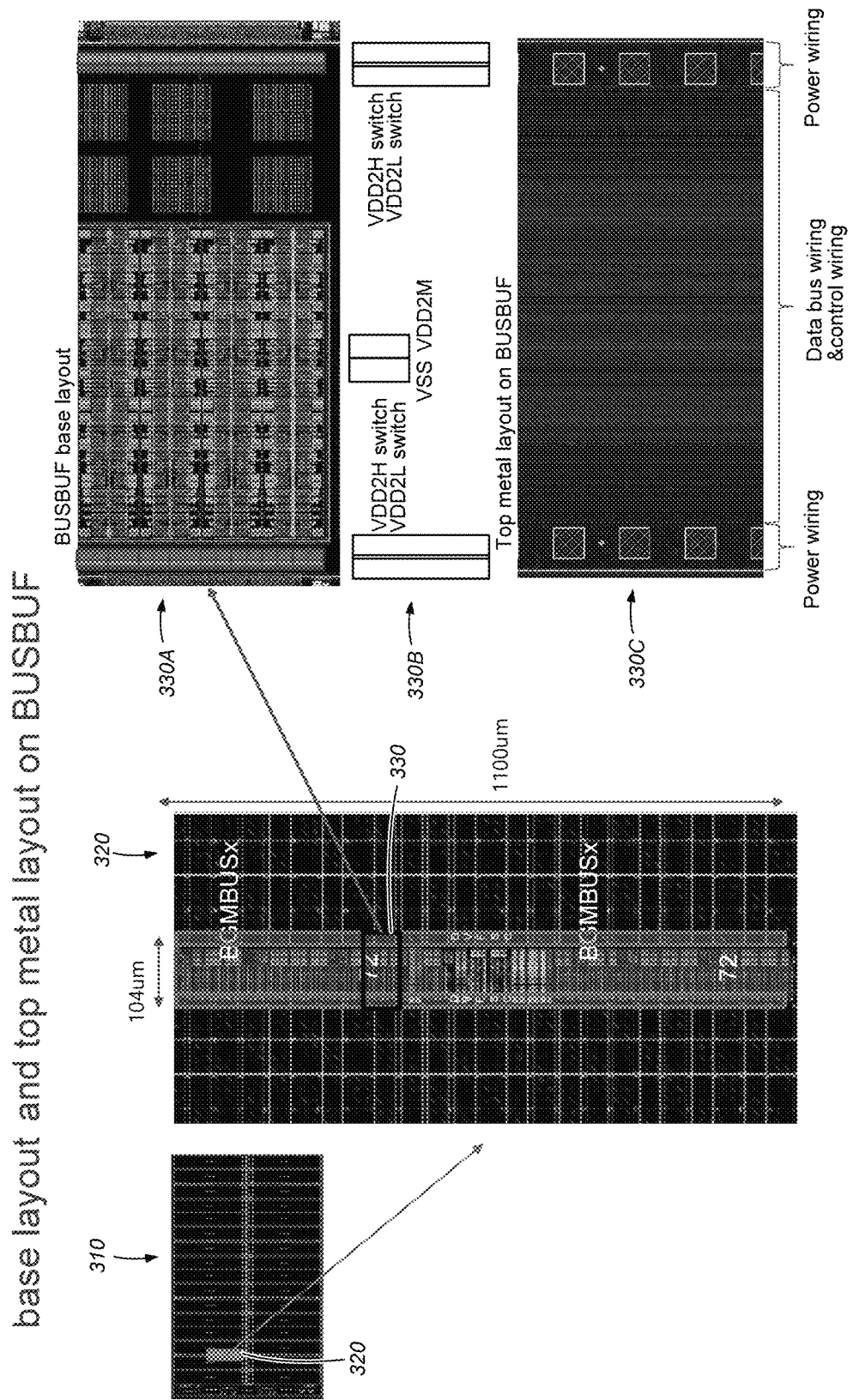
FIG. 3 includes layout diagrams showing details at various magnifications of a semiconductor device.

FIG. 3 includes layout diagrams showing details at various magnifications of portions a semiconductor device. A first region 310 shows a second region 320 within it. The second region 320 is expanded to see additional detail to the right of the first region 310. The second region 320 shows a third region 330 within it. To the right side of FIG. 3, three different views of the third region 330 are illustrated.

View 330A shows a base layout of the third region 330 where various electronic devices, such as switches 115 and 135 and the buffers 150, may be formed for the BUSBUF function. View 330B shows the same third region 330, but illustrates areas within the third region 330 where the VDD2H and VDD2L switches and routing may be located, and where the VSS and VDD2M (i.e., operating power signal 140) may be located.

View 330C shows the same third region 330, but illustrates data bus, control bus, and power bus wiring on the M4 layer 210. While the individual wiring is not readily visible in view 330C, the region is very crowded with many signal wires (e.g., 72 data bus wires, as well as wires for other signals) extending from top to bottom of view 330C. This region is very congested with wiring and adding additional wring on the M4 layer 210 to create routing for two different VDD signals (i.e., VDD2L and VDD2H) would cause the size of the semiconductor device to grow.

Figure 4:
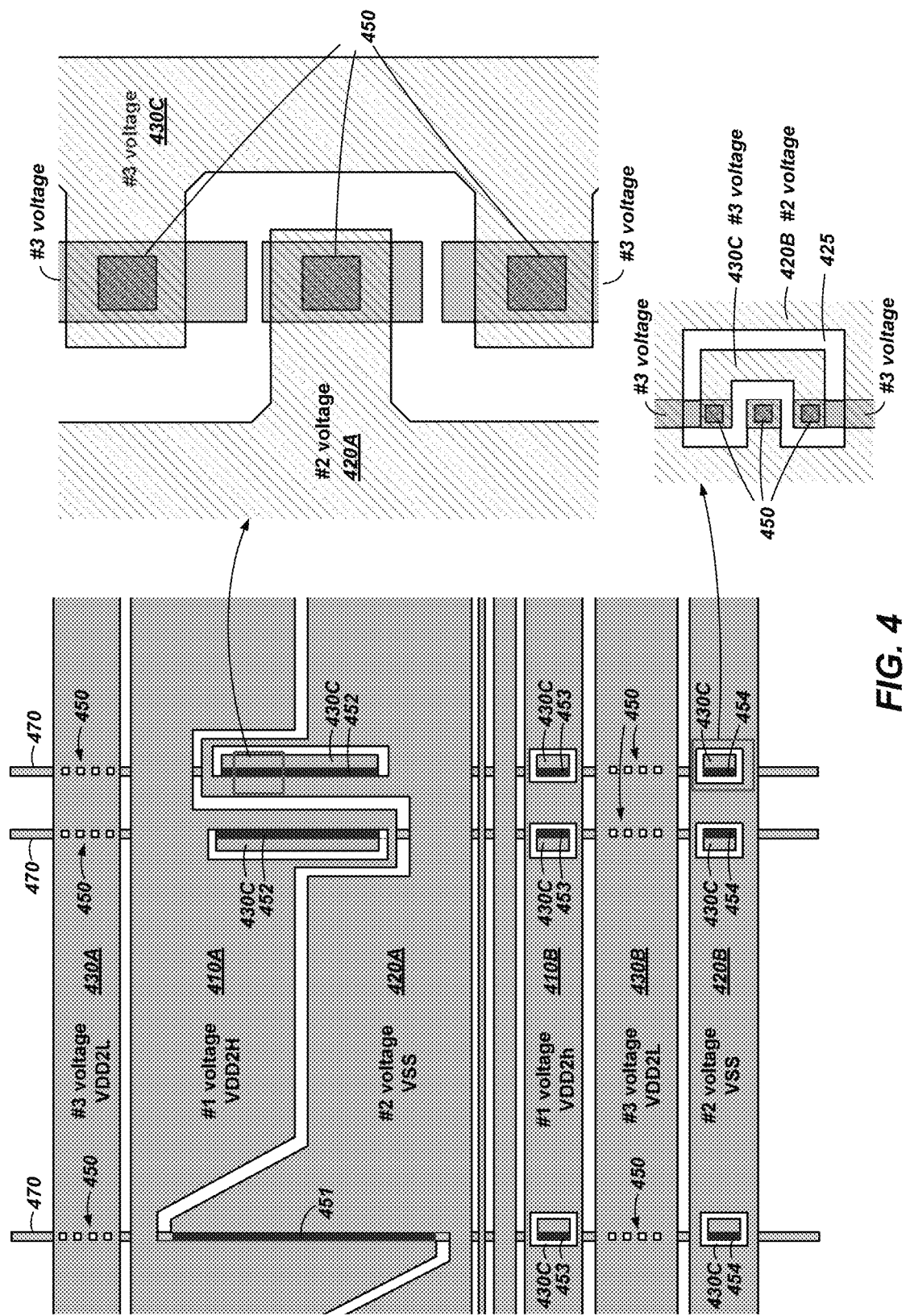
FIG. 4 is a plan view of wiring layers according to embodiments of the present disclosure.

FIG. 4 is a plan view of wiring layers according to embodiments of the present disclosure to accommodate routing of the VSS signal as well as the two different VDD signals. On the left side of the drawing, a group of wide wire busses are illustrated in the iRDL layer extending horizontally. A wide traces 410A conveys a first voltage (e.g., VDD2H) and a wide trace 420A conveys a second voltage (e.g., VSS). Other power voltage traces are also illustrated as; voltage trace 430A conveying a third voltage (e.g., VDD2L), another voltage trace 410B conveying the first voltage, another voltage trace 430B conveying the third voltage, and another voltage trace 420B conveying the second voltage.

This region includes a congested area of many traces on the M4 layer extending up and down on the page. For clarity, these M4 traces are not illustrated except for three M4 trace channels 470 that may be configured to couple to iRDL traces above them at various places. These M4 trace channels 470 are not continuous wires of M4 wiring. Rather, they may be separated at various places to create different signal routings on the M4 layer.

For voltage trace 430A and 430B, M4 contacts 450 convey the third voltage down to each of the illustrated M4 trace channels 470 to be fanned out to other areas and circuits on the M4 layer and lower layers. M4 contacts 450 on the left side of voltage trace 410B convey the first voltage down to the M4 trace channel 470 on the left side to be fanned out to other areas and circuits. Similarly, M4 contacts on the left side of voltage trace 420B convey the second voltage down to the M4 trace channel 470 on the left side to be fanned out to other areas and circuits.

The two wide traces 410A and 420A include an angled zig-zag on the left side to accommodate a layer transition region 451. On the right side, the two wide traces 410A and 420A include a serpentine arrangement to route around and accommodate layer transition regions 452.

Signal traces may also be referred to herein as polygonal structures. As non-limiting examples, polygonal structures may include continuous structures on any given layer and may be: simple rectangles as polygonal structures 430A, and 430B; polygonal structures with various turns, angles, and width transitions such as polygonal structures 410A and 420A; and polygonal structures with cutout regions along an edge of the polygon or within the polygon as shown in polygon structures 410B and 420B.

Layer transition regions 451, 452, 453, and 454 may include many M4 contacts (not shown in the view on the left side of FIG. 4) to convey signals between the M4 layer and the iRDL layer. These layer transition regions may be configured as alternating contacts in an interdigitized polygon arrangement (also referred to herein as interdigitized fingers) as shown in the expanded views on the right side of FIG. 4.

The layer transition region 451 is configured to distribute the first voltage and the second voltage through groups of M4 contacts over a wider region underneath both of the two wide traces 410A and 420A for underlying layers to distribute these voltages to the BUSBUF circuits and switch regions.

The layer transition regions 452 are configured to supply the third voltage, through groups of M4 contacts (not shown in the view on the left side of FIG. 4) to distribute the third voltage over a wide area underneath both of the two wide traces 410A and 420A. The layer transition regions 452 also create a low impedance connection that may include a variety of segments coupled with M4 contacts between the iRDL layer and the M4 layer, and without adding an extra wiring track to the M4 layer.

Details of a portion of one of the layer transition regions 452 is shown in an expanded view at the upper right portion of FIG. 4. In this expanded view, the iRDL layer is shown as cross-hatched regions and the M4 layer is shown as lightly-shaded regions. A portion of the polygonal structure 420A is coupled to a middle M4 contact to convey the second voltage between the M4 layer and the iRDL layer. A portion of the polygonal structure 430C is coupled to upper and lower M4 contacts to convey the third voltage between the M4 layer and the iRDL.

In addition, the polygonal structure 430C creates a bypass structure to continue the third voltage further up the page and further down the page. As can be seen in the view on the left side of FIG. 4, a large cutout region is created in the polygonal structure 420A. Within that cutout region, an island polygon 430C creates the bypass structure to convey the third voltage up the page and down the page bypassing around the M4 contacts for the polygonal structure 420A. Thus, the pattern of interdigitized polygon structure 420A and 430C shown in the upper right expanded view repeats many times to create a large number of contacts for both the second voltage and the third voltage in a repeating pattern of interdigitized fingers.

The other layer transition region 452 is the same type of structure, but in a mirrored arrangement and creating the interdigitized polygons for the first voltage on polygonal structure 410A and the third voltage on another island polygon 430C for conveying the third voltage.

Layer transition regions 454 are configured to supply the second voltage down to the M4 layer and provide a bypass structure to continue the third voltage above and below the layer transition regions. An expanded view for one of the layer transition regions 454 is shown at the bottom left side of FIG. 4. The middle M4 contact 450 is configured to convey the second voltage between the M4 layer and the iRDL layer. A small cutout region 425 is created in the polygonal structure 420B. Within that cutout region, an island polygon 430C creates the bypass structure to convey the third voltage up the page and down the page bypassing around the M4 contacts for the polygonal structure 420B.

The other layer transition region 454 on the left side is the same type of structure and the layer transition region 454 for the middle M4 trace channel 470 is the same type of structure, but in a mirrored arrangement. Both of these layer transition regions create the interdigitized polygons for the second voltage on polygonal structure 420B and the third voltage on another island polygon 430C for conveying the third voltage.

Similar to layer transition regions 454, layer transition regions 453 are configured to supply the first voltage (rather than the second voltage) down to the M4 layer and provide a bypass structure to continue the third voltage above and below the layer transition regions.

Figure 5:
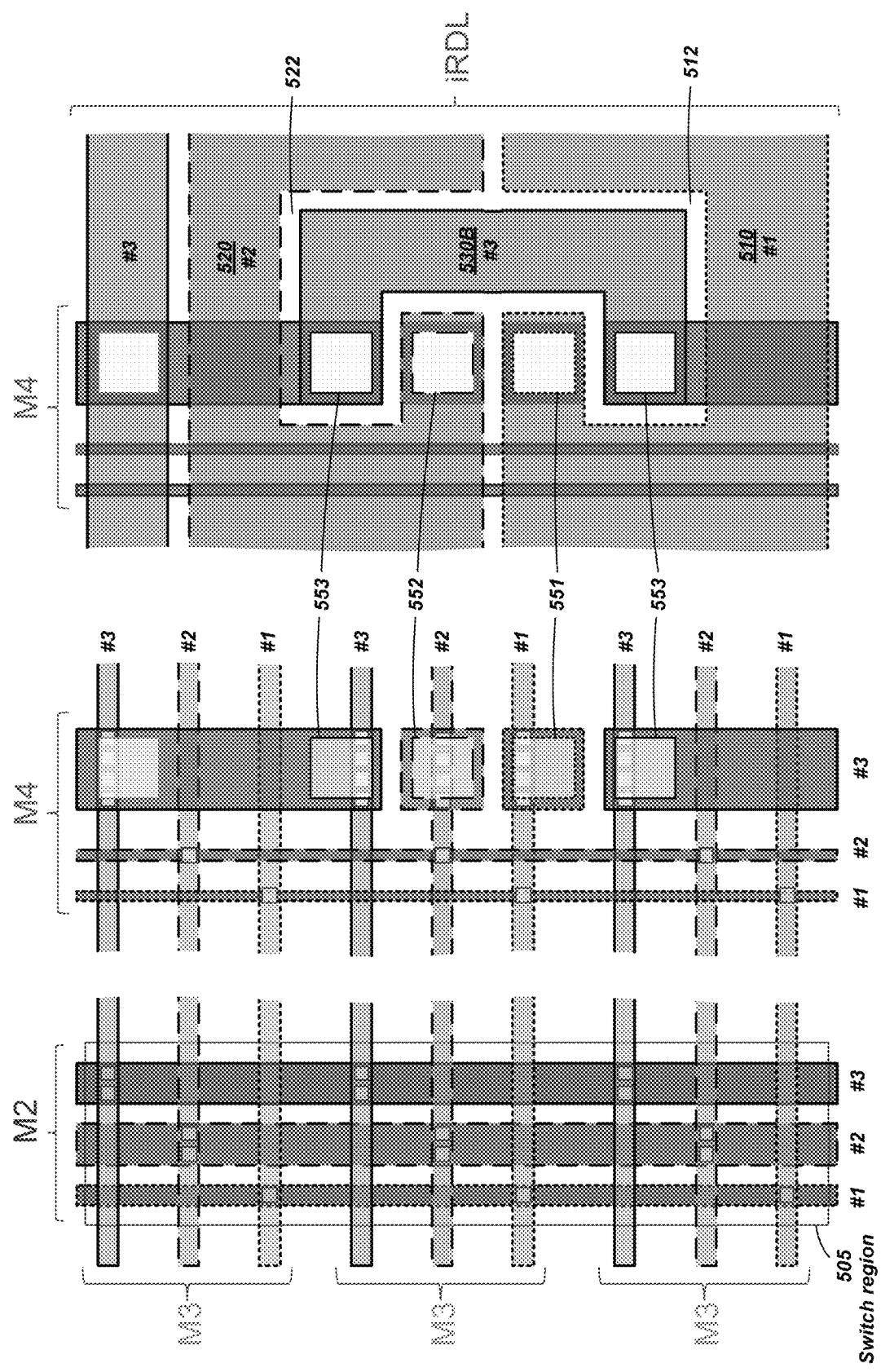
FIG. 5 shows plan views of wiring layers for routing power signals according to embodiments of the present disclosure.

FIG. 5 shows plan views of wiring layers for routing power signals according to embodiments of the present disclosure. This embodiment may be useful for distributing power signals in the layer transition region 451 shown in FIG. 4.

These three different views show the same region of the semiconductor device, but including diffident layers in each view. Thus, these views should be considered as stacked on top of each other from a cross-section perspective. The view on the right shows the iRDL layer, the M4 layer, and M4 contacts. The middle view shows the same M4 layer and M4 contacts, but also includes the M3 layer and M3 contacts. The view on the left shows the same M3 layer, but also shows the M2 layer and M2 contacts. In general, M2 signal traces run up and down on the page, M3 signals traces run left to right on the page, M4 signal traces run up and down on the page, and iRDL signal traces run left to right on the page. Signal traces conveying the third voltage are shown with a solid line border, signal traces conveying the second voltage are shown with a dashed line border, and signal traces conveying the first voltage are shown with a dotted line border.

In embodiments of the present disclosure, the wide trace channel in the M4 layer conveys the third voltage and would do so with a solid trace up and down on the page, except contacts between the iRDL layer and the M4 layer are needed for the first voltage and the second voltage. To accomplish this scenario, a first cutout region 512 is created in the first polygonal structure 510 conveying the first voltage. Similarly, a second cutout region 522 is created in the second polygonal structure 520 conveying the second voltage.

These cutout regions 522 are slightly different than the cutout regions in FIG. 4. In FIG. 4 the cutout regions were completely enclosed by the polygonal structure around them. Thus, the FIG. 4 cutout regions may be considered a void within the larger polygonal structure. In FIG. 5 the cutout regions occur on a perimeter of the polygonal structure. Thus, the cutout regions of FIG. 4 may be considered a reconfiguration of the perimeter of the polygonal structure.

Within the first cutout region 512 and the second cutout region 522, a bypass structure 530B (e.g., an island polygon) on the iRDL layer creates a way to connect the upper M4 polygon to the lower M4 polygon via the M4 contacts 553 at the top and bottom of the bypass structure 530B.

The M4 contact 551 connects the first voltage on the iRDL layer to a square on the M4 layer. The M3 contacts, below the M4 contact 551, connect the first voltage down to the M3 layer. Similarly, the M4 contact 552 connects the second voltage on the iRDL layer to a square on the M4 layer. M3 contacts below the M4 contact 552 connect the first voltage down to the M3 layer. Finally, M3 contacts below the M4 contacts 553 connect the third voltage down to the M3 layer.

On the left side, various M2 contacts connect each of the first voltage, second voltage, and third voltage from the M3 layer down to the M2 layer where they can be further distributed down to the active area containing the switch region 505 for selecting either the first voltage or the third voltage as the operating power signal for the bus buffers.

FIG. 5 only shows one bypass structure 530B. However, for wider busses of the second voltage and third voltage, additional bypass structures 530B with their M4 contacts 553, the M4 contact 552, and the M4 contact 551 may be repeated up and down the page to create a stitching pattern for connecting the third voltage continuously between the top and bottom by transitioning between the iRDL layer and the M4 layer through M4 contacts and bypass structures.

Figure 6:
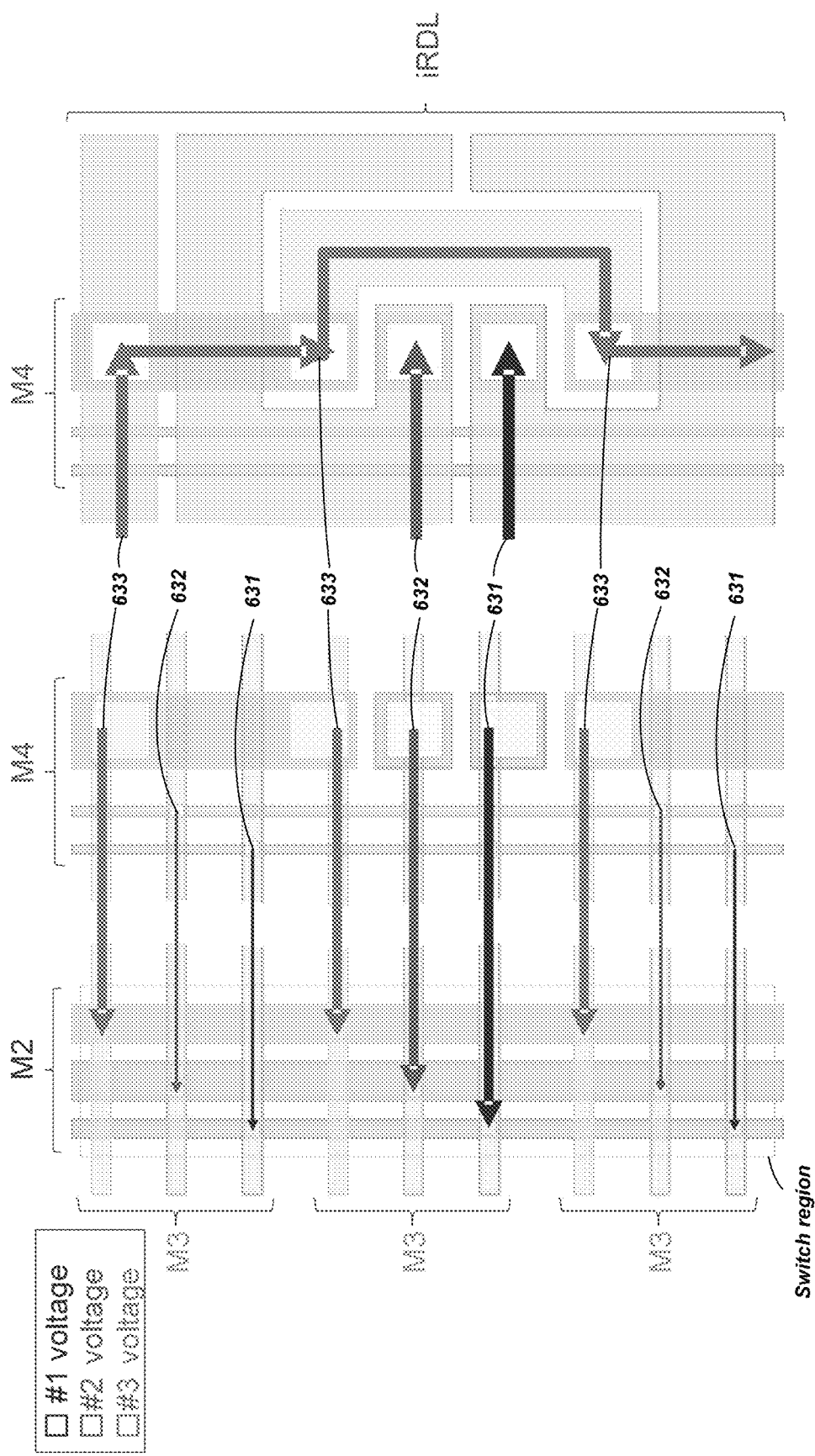
FIG. 6 shows current supply paths for the power signal routings of FIG. 5.

FIG. 6 shows current supply paths for the power signal routings of FIG. 5. Starting at the top and working from the middle view to the left view, the third voltage 633 moves from the M4 layer, down through M3 contacts to the M3 layer and to the left along an M3 signal trace to be distributed down to lower layers. Next down, the second voltage 632 moves from the M4 layer, down through an M3 contact to the M3 layer and to the left along an M3 signal trace to be distributed down to lower layers. Next down, the first voltage 631 moves from the M4 layer, down through an M3 contact to the M3 layer and to the left along an M3 signal trace to be distributed down to lower layers. This pattern is repeated two more times moving down the page for the third voltage 633, the second voltage 632 and the first voltage 631.

Starting again from the top and working from the middle view to the right view, the third voltage 633 moves from the M4 layer up through an M4 contact to the iRDL layer and also moves down the page on the M4 layer to another M4 contact, which takes the third voltage 633 up to the bypass structure on the iRDL layer. The third voltage 633 moves through the bypass structure on the iRDL layer, down through an M4 contact back to the M4 layer, then down to the bottom of the page on the M4 layer.

Near the middle of the page and working to the right from the middle view, the second voltage 632 moves from the M4 layer up through an M4 contact to the iRDL layer. Similarly, the third voltage 633 moves from the M4 layer up through an M4 contact to the iRDL layer.

FIG. 6 is intended to show connections and signal paths for the various voltages through the various layers. The arrows should not be interpreted to indicate actual current flow direction, as current may flow in either direction along the signal paths.

Figure 7:
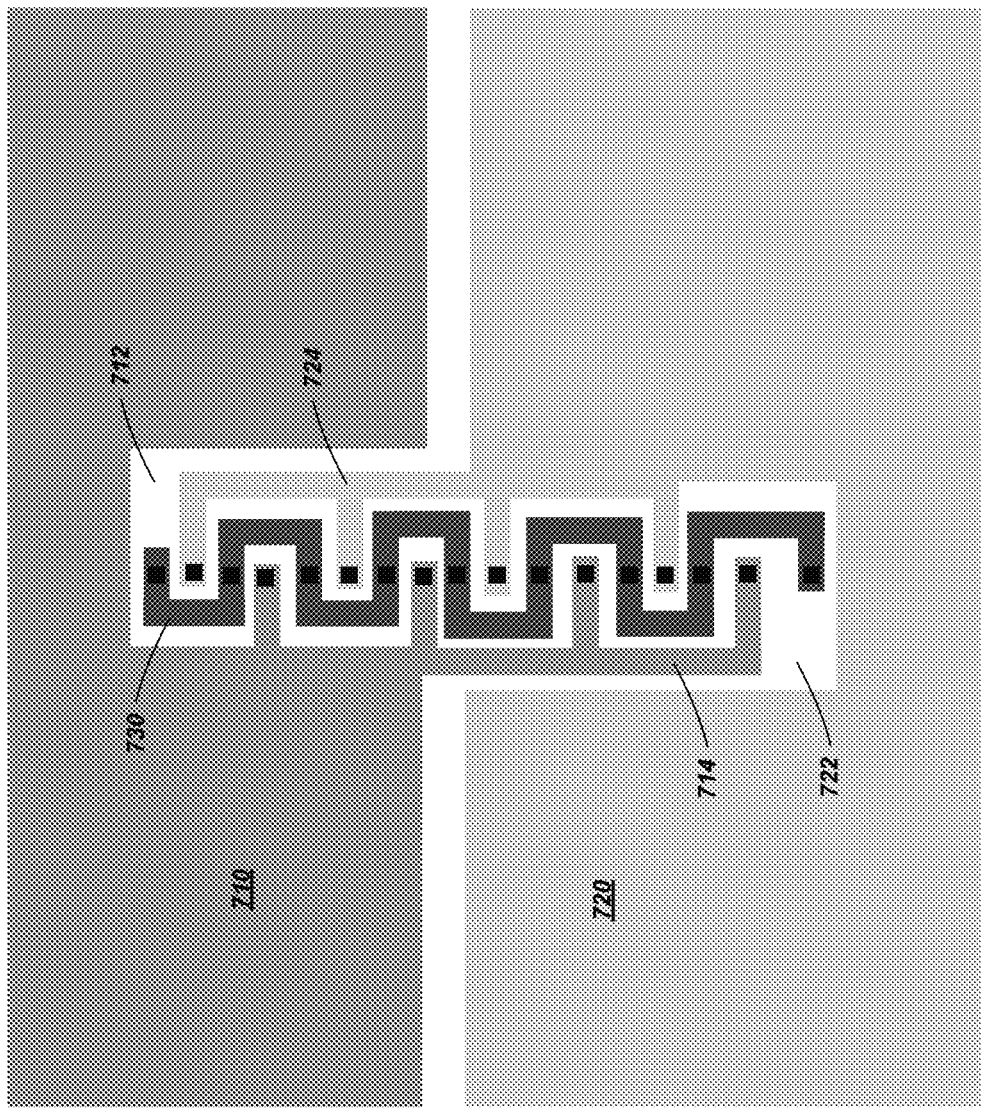
FIG. 7 is a plan view of an alternative arrangement of interlayer strapping according to embodiments of the present disclosure.

FIG. 7 is a plan view of an alternative arrangement of interlayer strapping according to embodiments of the present disclosure. A first polygonal structure 710 conveys a first voltage, a second polygonal structure 720 conveys a second voltage, and a third polygonal structure 730 conveys a third voltage. As with the embodiments of FIGS. 4, 5, and 6, M4 contacts arranged up and down the page connect to M4 signal traces in an M4 trace channel (not shown) under the M4 contacts. As with the other embodiments, the M4 trace channel may include many small M4 traces for connecting to the various voltages. The FIG. 7 embodiment includes a first cutout region 712 in the first polygonal structure 710 and a second cutout region 722 in the second polygonal structure 720. In addition, the first polygonal structure 710 includes an extension region 714 extending downward into the second cutout region 722 to create more interdigitized polygons. Similarly, the second polygonal structure 720 includes an extension region 724 extending upwards into the first cutout region 712 to create more interdigitized polygons. The third polygonal structure is an island polygon in a serpentine arrangement weaving through the interdigitized fingers of the first polygonal structure 710 and the second polygonal structure 720.

FIG. 8 is a simplified block diagram of a system 800 implemented according to one or more embodiments described herein. The system 800 may include at least one input device 802. Non-limiting examples of the input devices 802 include sensors, a keyboard, a mouse, a touch screen, or other user interface type inputs. The electronic system 800 further includes at least one output device 804. Non-limiting examples of the output devices 804 include a monitor, touch screen, or speaker. The input devices 802 and the output devices 804 are not necessarily separable from one another. The electronic system 800 further includes a storage device 806. The input device 802, the output device 804, and the storage device 806 are coupled to one or more processors 808. The electronic system 800 further includes one or more memory devices 810 coupled to the processor 808 and configured with one or more embodiments of the present disclosure. The memory device 810 includes at least one memory cell (e.g., an array of memory cells), wherein one or more memory cells of memory device 810 may include a transistor. The electronic system 800 may be configured as a computing, processing, industrial, or consumer product. For example, without limitation, electronic system 800 may include a personal computer or computer hardware component, a server or other networking hardware component, a handheld device, a tablet computer, an electronic notebook, a camera, a phone, a music player, a wireless device, a display, a chip set, a game, a vehicle, or other known systems.

Conclusion

Embodiments of the present disclosure include a semiconductor device comprising a semiconductor substrate including transistor circuitry. The semiconductor device also includes a redistribution layer including a first polygonal structure for conveying a first power signal and including a first cutout region. The redistribution layer also includes a second polygonal structure for conveying a second power signal. The redistribution layer further includes an island polygon for conveying a third power signal and positioned within the first cutout region, wherein the island polygon does not touch the first polygonal structure. The semiconductor device also includes a first wiring layer includes one or more first-layer signal traces for conveying the third power signal, and a plurality of first-layer contacts coupling the one or more first-layer signal traces to the island polygon.

Embodiments of the present disclosure also include a semiconductor device comprising a semiconductor substrate including transistor circuitry. The semiconductor device also includes first signal traces configured for conveying a first power signal on a redistribution layer, a first wiring layer, and first-layer contacts coupled to the first signal traces. The semiconductor device further includes second signal traces configured for conveying a second power signal on the redistribution layer, the first wiring layer, and first-layer contacts coupled to the second signal traces. The semiconductor device further includes third signal traces configured for conveying a third power signal on the redistribution layer, the first wiring layer, and first-layer contacts coupled to the third signal traces. At least one of the first signal traces on the redistribution layer includes a cutout region. The third signal traces include a bypass structure on the redistribution layer and within the cutout region. The bypass structure is configured to convey the third power signal on the redistribution layer around the first-layer contacts coupled to the first signal traces on the redistribution layer.

Still other embodiments of the present disclosure include a system comprising one or more processors and at least one memory device operably coupled to the one or more processors. The memory device comprises a redistribution layer including a first polygonal structure for conveying a first power signal and including a first cutout region. The redistribution layer also includes a second polygonal structure for conveying a second power signal and including a second cutout region, and an island polygon for conveying a third power signal. The island polygon is positioned within the first cutout region and the second cutout region, wherein the island polygon does not touch the first polygonal structure or the second polygonal structure. The memory device also includes a first wiring layer comprising one or more first-layer signal traces for conveying the third power signal and a plurality of first-layer contacts coupling the one or more first-layer signal traces to the island polygon.

Terms used herein and especially in the appended claims are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternative useful combinations of the elements described, will become apparent to those skilled in the art from the description. Such modifications and embodiments also fall within the scope of the appended claims and equivalents.

What is claimed is:

1. A device, comprising:
    a redistribution layer comprising:
        a first polygonal structure for conveying a first power signal and including a first cutout region;
        a second polygonal structure for conveying a second power signal; and
        an island polygon for conveying a third power signal and positioned within the first cutout region, wherein the island polygon does not touch the first polygonal structure.

2. The device of claim 1, further comprising:
    a wiring layer for conveying the third power signal; and
    a number of contacts coupling the wiring layer to the island polygon.

3. The device of claim 2, wherein:
    the wiring layer further comprises a number of first signal traces for conveying each of the first power signal, the second power signal, and the third power signal; and
    the device further comprises a second wiring layer comprising:
        a number of second signal traces for conveying each of the first power signal, the second power signal, and the third power signal; and
        a number of contacts coupling the number of first signal traces to the number of second signal traces.

4. The device of claim 2, wherein:
    the first polygonal structure and the island polygon include first interdigitized fingers for coupling to a first set of contacts of the number of contacts; and
    the second polygonal structure and the island polygon include second interdigitized fingers for coupling to a second set of contacts of the number of contacts.

5. The device of claim 4, wherein the island polygon forms a serpentine arrangement through first interdigitized fingers and the second interdigitized fingers.

6. The device of claim 1, wherein:
    the second polygonal structure includes a second cutout region; and
    the island polygon is further positioned within the second cutout region.

7. The device of claim 1, wherein:
    the first power signal comprises a first VDD signal;
    the second power signal comprises a VSS signal; and
    the third power signal comprises a second, lower VDD signal.

8. The device of claim 1, further comprising transistor circuitry configured to pass the first power signal and the third power signal to an operating power signal.

9. The device of claim 8, wherein the operating power signal comprises a VDD signal for buffers driving a data bus and the second power signal comprises a VSS signal for the buffers driving the data bus.

10. The device of claim 1, wherein the first cutout region forms a void in the first polygonal structure.

11. The device of claim 1, wherein the first cutout region forms a modification of a perimeter of the first polygonal structure.

12. A device, comprising:
    a redistribution layer comprising:
        a first signal trace for conveying a first power signal and including a cutout region; and
        a second signal trace including a bypass structure within the cutout region and configured to convey a second power signal; and
    a first wiring layer comprising one or more first-layer signal traces for conveying the second power signal.

13. The device of claim 12, further comprising a third signal trace including a second cutout region and configured to convey a third power signal, wherein the second signal trace is within the second cutout region.

14. The device of claim 13, wherein the second signal trace does not touch the third signal trace.

15. The device of claim 14, further comprising a number of contacts coupling the first-layer signal traces to the second signal trace.

16. A system, comprising:
    one or more processors; and
    at least one memory device operably coupled to the one or more processors and comprising:
        a redistribution layer comprising:
            a first polygonal structure for conveying a first power signal and including a first cutout region; and
            an island polygon structure for conveying a second power signal and positioned within the first cutout region, wherein the island polygon structure does not touch the first polygonal structure.

17. The system of claim 16, the redistribution layer further comprising a second polygonal structure including a second cutout region and configured for conveying a third power signal.

18. The system of claim 17, wherein the island polygon structure is further positioned within the second cutout region and the island polygon structure does not touch the second polygon structure.

19. The system of claim 17, wherein the island polygon structure forms a serpentine arrangement through first interdigitized fingers of the first polygonal structure and second interdigitized fingers of the second polygonal structure.

20. The system of claim 16, further comprising:
- a first wiring layer comprising one or more first-layer signal traces for conveying the second power signal; and
- a plurality of first-layer contacts coupling the one or more first-layer signal traces to the island polygon structure.

* * * * *